United States Patent

[11] 3,620,692

[72] Inventors David Louis Franklin
Somerville;
Leon Martin Balents, South Bound Brook,
both of N.J.

[21] Appl. No. 24,588
[22] Filed Apr. 1, 1970
[45] Patented Nov. 16, 1971
[73] Assignee RCA Corporation

[54] MOUNTING STRUCTURE FOR HIGH-POWER SEMICONDUCTOR DEVICES
4 Claims, 1 Drawing Fig.

[52] U.S. Cl. 29/195, 317/234 M
[51] Int. Cl. B32b 15/04
[50] Field of Search 317/234, 5.3; 29/195

[56] References Cited

UNITED STATES PATENTS

| | | | |
|---|---|---|---|
| 2,971,251 | 2/1961 | Willemse | 29/195 |
| 3,050,667 | 8/1962 | Emeis | 317/240 |
| 3,159,462 | 12/1964 | Kadelburg | 29/195 |
| 3,178,271 | 4/1965 | Maissel et al. | 29/195 |
| 3,184.824 | 5/1965 | Fairbairn | 29/578 |
| 3,268,309 | 8/1966 | Frank et al | 29/195 |
| 3,273,979 | 9/1966 | Budnick | 29/195 |

*Primary Examiner*—L. Dewayne Rutledge
*Assistant Examiner*—E. L. Weise
*Attorney*—Glenn H. Bruestle

ABSTRACT: The structure includes a thick member having a thermal expansion coefficient closely matching that of the device, and a thin metal layer having high thermal diffusivity disposed on the thick member. The metal layer is between 2.0 and 20.0 mils thick, to provide sufficient thermal diffusivity between the device and the thick member, and still allow the thermal expansion coefficient of the structure to be determined by the thick member. The device is mounted on the exposed surface of the metal layer.

PATENTED NOV 16 1971 3,620,692
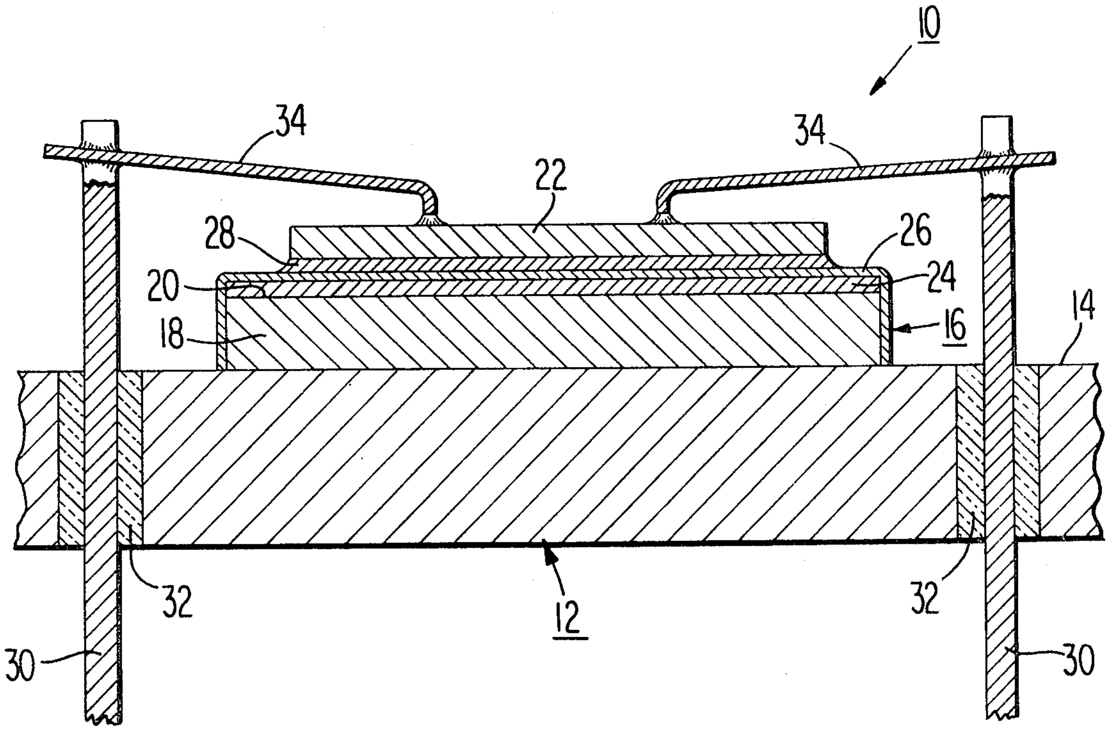
INVENTORS.
Leon M. Balents and
David L. Franklin.
BY
Glenn H. Bruestle
ATTORNEY

MOUNTING STRUCTURE FOR HIGH-POWER SEMICONDUCTOR DEVICES

BACKGROUND OF THE INVENTION

The present invention relates to semiconductor devices, and, in particular, relates to improved mounting structures for semiconductor devices.

In the manufacture of high-power semiconductor devices, such as power transistors, thyristors, and the like, the device is usually soldered or brazed to a substrate. Copper is widely employed as a substrate material, because it has excellent thermal diffusivity, and thus can conduct heat away from the power device during operation more efficiently than less thermally diffusive materials. The thermal diffusivity of copper substrates is particularly advantageous for use with power devices which function in a pulse mode of operation since copper can effectively conduct the heat away from the device during the period between successive pulses. However, copper has a serious disadvantage in that its coefficient of thermal expansion is much greater than that of either germanium or silicon, the materials from which most semiconductor power devices are fabricated. Thus, during thermal cycling of a device mounted on a copper substrate, i.e., during cooling and heating between periods of operation, the device and solder joint are subjected to mechanical stresses caused by uneven expansion and contraction of the device and the copper substrate. This problem is especially severe in silicon devices having dimensions in excess of 100 mils on an edge.

In order to avoid the thermal expansion mismatch problems of copper, other substrate materials having thermal expansion coefficients closely matching that of silicon and germanium have been employed. Tungsten, aluminum oxide, beryllium oxide, and particularly molybdenum, have proven to be useful in this respect. However, while these materials provide the desired thermal expansion matching, they are not as thermally diffusive as copper, and thus, provide less thermal dissipation that copper substrates. Since the power capability of a semiconductor device is directly related to its heat dissipation characteristics, a device mounted on a substrate of one of these materials is not capable of operating at the increased power level of the same device mounted on a copper substrate. It is therefore desirable to employ a semiconductor device substrate which provides the good thermal expansion matching characteristics of molybdenum, and which also has the excellent thermal diffusivity properties of metals like copper. In fact, multilayered substrate structures employing a thermal expansion matching layer and a thermal diffusion layer are known in the art; see, for example, Willemse, U.S. Pat. No. 2,971,251, and Frank et al., U.S. Pat. No. 3,268,309. While these types of substrates represent an improvement over the use of copper or molybdenum alone, the thermal diffusivity of such structures have proven to be less than that required for high power semiconductor devices, especially those devices which are designed to function in a pulse mode of operation.

SUMMARY OF THE INVENTION

The present invention is an improved mounting structure for a high power semiconductor device. The structure comprises a relatively thick member having a major surface; the thick member has a thermal expansion coefficient closely matching that of the device. Disposed on the surface of the member is a relatively thin layer of a metal having high-thermal diffusivity. The metal layer is between 2.0 and 20.0 mils thick, so as to provide sufficient thermal diffusivity, and still allow the thermal expansion characteristics of the structure to be determined by the thick member. The device is mounted on the exposed surface of the metal layer.

THE DRAWING

The single FIGURE of the drawing is a cross section of a power transistor employing the improved mounting structure of the present invention.

DETAILED DESCRIPTION

A preferred embodiment of the improved mounting structure will be described with reference to the drawing, which illustrates a power transistor 10.

The transistor 10 includes a header 12 having an upper surface 14 with a device substrate 16 mounted on the surface. The substrate 16 comprises a relatively thick member 18 having an upper major surface 20. The thick member 18 has a thermal expansion coefficient closely matching that of a semiconductor device 22 which is mounted on the substrate 16. For a device 22 fabricated from germanium or silicon, suitable materials for the thick member 18 include molybdenum, tungsten, aluminum oxide, and beryllium oxide; however, molybdenum is preferred.

A relatively thin layer 24 of a metal having high-thermal diffusivity is disposed on the surface 20 of the member 18. Suitably, the metal layer 24 is selected from a group consisting of copper, silver, aluminum, and gold; however, copper is preferred. Thermal diffusivity is a term well known in the thermal dynamics art. It is a measure of the rate at which a particular material diffuses heat, and is related to the thermal conductivity, thermal capacitance, and density of that material by the expression $$D=\frac{k}{\rho c}$$

where:

D= thermal diffusivity k= thermal conductivity

ρ= density c= thermal capacitance.

The metal layer 24 is at least 2.0 mils thick, in order to provide sufficient thermal diffusivity between the device 22 and the thick member 18. Further, the layer 24 is no thicker than 20.0 mils, in order that the thermal expansion characteristics of the substrate 16 are determined by the thick member 18. Since the 2.0 to 20.0 mil thickness range represents the extreme limits, it is preferred that the thickness of the layer 24 be well within these limits; for example, between 5.0 to 15.0 mils thick.

The device 22 may be mounted on the exposed surface of the metal layer 24; however, to provide increased resistance to corrosion and oxidation, a thin plate of either nickel or gold is disposed on the exposed surface of the metal layer 24 and the sides of the member 18. The device 22 is mounted on the metal plate 26 adjacent the metal layer 24 by means of a solder joint 28. The transistor 10 is completed with two metal terminal posts 30 extending through the header 12 and insulated therefrom by insulating means 32, and metal interconnecting clips 34 interconnecting the semiconductor device with the metal posts 30.

The improved mounting structure may be fabricated by well-known metal working techniques; for example, by cladding or brazing the thin metal layer 24 to the thick member 18, brazing the substrate 16 to the header 12, depositing the nickel plate 26 using any electroless nickel plating method, and thereafter soldering the device to the nickel plating.

EXAMPLE

The improved mounting structure was employed in a power transistor having the JEDEC designation 2N5804, which was fabricated from a silicon chip 210.0 mils square and 7.0 mils thick. The substrate included a relatively thick molybdenum member which was 300.0 mils square and 30.0 mils thick. A thin layer of copper, 5.0 mils thick was disposed on the thick molybdenum layer.

Since silicon has a thermal expansion coefficient of between 2.6 to 3.0 parts per million/° C., and molybdenum has a thermal expansion coefficient or 5.4 p.p.m./° C., then the thermal expansion coefficient of molybdenum closely matches that of silicon, especially in relation to copper, which has a coefficient of 17.5 p.p.m./° C. On the other hand, silicon, molybdenum, and copper have thermal diffusivity characteristics of 0.8, 0.536, and 1.062 cm.²/sec., respectively. It was found in the 2N5804 device described above that the 5.0 mil copper layer provided excellent thermal diffusivity between the device and the molybdenum member, but was of sufficient thinness to allow the thermal expansion characteristics to be determined by the molybdenum.

Thus, the improved mounting structure of the present invention provides the following advantages. First, the metal layer adjacent the device has high-thermal diffusivity characteristics and is within a critical thickness range which ensures that the effective power capability of the device mounted on the substrate can be realized. Second, the thick member has a thermal expansion coefficient closely matching that of the device, and provides good thermal fatigue capabilities. Third, the critical thickness range of the high-thermal conductivity metal layer allows the thermal expansion characteristics to be determined by the thick member.

We claim:

1. A structure for a high-power semiconductor device, comprising:

a high-power semiconductor device;

a relatively thick member having a major surface, said member having a thermal expansion coefficient closely matching that of said device;

a relatively thin metal layer of high-thermal diffusivity on said surface, said layer being between 2.0 and 20.0 mils thick; and said device mounted on the exposed surface of said layer.

2. A structure according to claim 1, wherein said member is selected from a group consisting of molybdenum, tungsten, aluminum oxide, and beryllium oxide, and wherein said layer is selected from a group consisting of copper, silver, aluminum, and gold.

3. A structure according to claim 1, wherein said member consists essentially of molybdenum and said layer consists essentially of copper.

4. A structure for a high-power semiconductor device, comprising:

a high-power semiconductor device;

a relatively thick member having a major surface, said member having a thermal expansion coefficient closely matching that of said device;

a relatively thin metal layer of high thermal conductivity on said surface, said layer being between 2.0 and 20.0 mils thick;

a thin gold or nickel plate on said layer; and said device mounted on said gold or nickel plate.

* * * * *